United States Patent
Yamada et al.

(10) Patent No.: US 10,089,795 B2
(45) Date of Patent: Oct. 2, 2018

(54) METHOD AND APPARATUS FOR DETERMINING ARRANGEMENT POSITION OF LEADER LINE

(71) Applicant: FUJITSU LIMITED, Kawasaki-shi, Kanagawa (JP)

(72) Inventors: Masahiko Yamada, Kawasaki (JP); Terutoshi Taguchi, Ichikawa (JP); Shou Suzuki, Saitama (JP)

(73) Assignee: FUJITSU LIMITED, Kawasaki (JP)

( * ) Notice: Subject to any disclaimer, the term of this patent is extended or adjusted under 35 U.S.C. 154(b) by 75 days.

(21) Appl. No.: 14/926,071

(22) Filed: Oct. 29, 2015

(65) Prior Publication Data

US 2016/0133059 A1    May 12, 2016

(30) Foreign Application Priority Data

Nov. 11, 2014   (JP) .................................. 2014-228973

(51) Int. Cl.
*G06T 19/20*    (2011.01)
*G06T 15/20*    (2011.01)
*G06F 17/50*    (2006.01)

(52) U.S. Cl.
CPC .............. *G06T 19/20* (2013.01); *G06F 17/50* (2013.01); *G06F 17/509* (2013.01); *G06T 15/20* (2013.01); *G06T 2219/004* (2013.01)

(58) Field of Classification Search
CPC .......... G06T 19/20; G06T 15/20; G06F 17/50
See application file for complete search history.

(56) References Cited

U.S. PATENT DOCUMENTS

| | | | | |
|---|---|---|---|---|
| 2001/0043236 A1* | 11/2001 | Yamamoto | ............. | G06T 19/20 715/781 |
| 2003/0210244 A1* | 11/2003 | Sasago | .................... | G06T 19/00 345/419 |
| 2003/0234782 A1* | 12/2003 | Terentyev | ............... | G06T 19/00 345/421 |

(Continued)

FOREIGN PATENT DOCUMENTS

| | | |
|---|---|---|
| JP | 02-264367 | 10/1990 |
| JP | 06-083881 | 3/1994 |

(Continued)

OTHER PUBLICATIONS

Korean Office Action dated Jun. 20, 2016 for corresponding Korean Patent Application No. 10-2015-0154973, with Partial English Translation, 9 pages.

(Continued)

*Primary Examiner* — William A Beutel
(74) *Attorney, Agent, or Firm* — Fujitsu Patent Center

(57) ABSTRACT

A leader line arrangement position determining apparatus includes a receiving unit, a determining unit, and an arranging unit. The receiving unit receives designation of a position of a viewpoint to display an object in a three-dimensional CAD space in which the object is arranged. The determining unit, when the three-dimensional CAD space in which the object is arranged is displayed from the designated viewpoint, determines a shape of the object displayed when viewed from the viewpoint. The arranging unit arranges one end of a leader line at a position determined from the determined shape of the object.

4 Claims, 15 Drawing Sheets

(56) References Cited

U.S. PATENT DOCUMENTS

| | | | | |
|---|---|---|---|---|
| 2009/0189899 A1* | 7/2009 | Satoh | ............... | G06Q 10/087 |
| | | | | 345/427 |
| 2012/0042235 A1* | 2/2012 | Morimoto | ............... | G06F 17/50 |
| | | | | 715/232 |
| 2012/0316840 A1 | 12/2012 | Dayde et al. | | |

FOREIGN PATENT DOCUMENTS

| | | |
|---|---|---|
| JP | 2002-324083 A | 11/2002 |
| JP | 2002-324085 | 11/2002 |
| JP | 2002-324086 | 11/2002 |
| JP | 2003-330970 | 11/2003 |
| JP | 2005-267280 A | 9/2005 |
| JP | 2009-176248 A | 8/2009 |

OTHER PUBLICATIONS

Extended European Search Report dated Mar. 2, 2016 for corresponding European Patent Application No. 15191209.4, 6 pages.
Japanese Office Action dated May 15, 2018 for corresponding Japanese Patent Application No. 2014-228973, with English Translation, 6 pages.
Chinese Office Action dated Jun. 19, 2018 for corresponding Chinese Patent Application No. 201510760714.7, 15 pages.

* cited by examiner

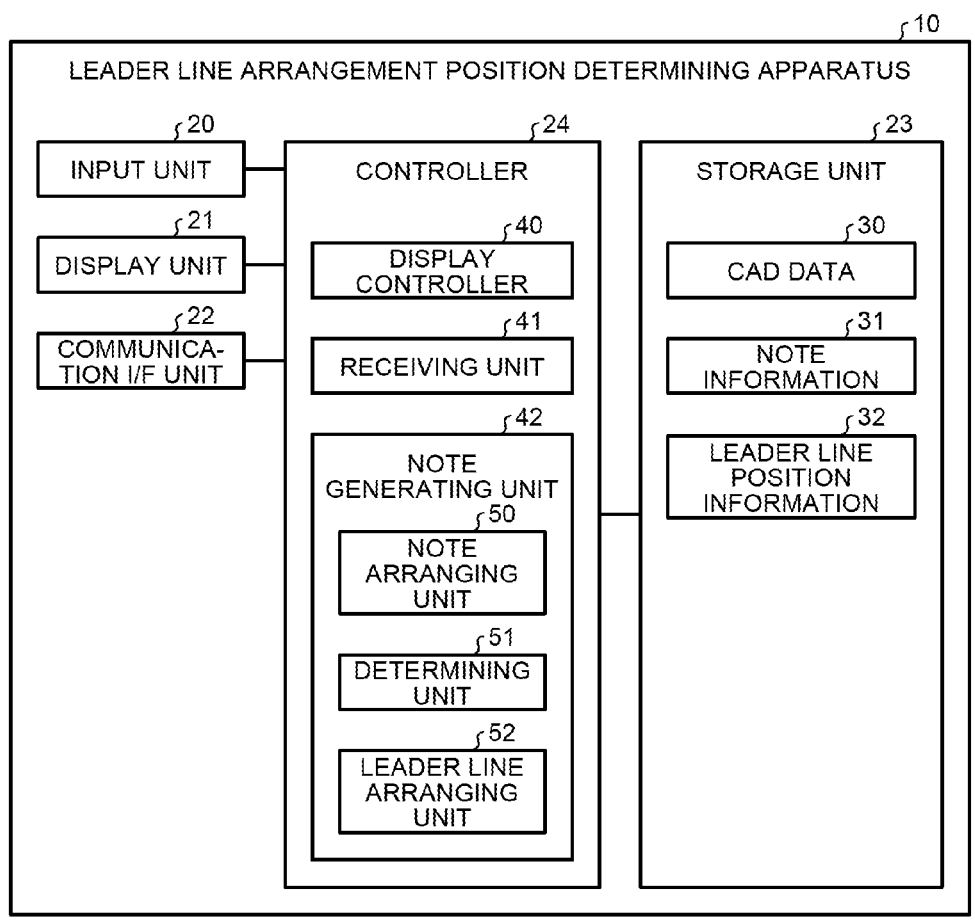

| ELEMENT TYPE | DATA STRUCTURE | EXAMPLE |
|---|---|---|
| SHAPE INFORMATION | APEX 1, APEX 2, APEX 3 OF FACET 1<br>  NORMAL VECTOR OF FACET 1<br>\|<br>APEX 1, APEX 2, APEX 3 OF FACET N<br>  NORMAL VECTOR OF FACET N | v11, v12, v13<br>Vec1<br><br>vn1, vn2, vn3<br>Vecn |

| PART NUMBER | COMMENT |
|---|---|
| 1 | |
| 2 | FIRMLY CONNECT |
| 3 | |
| 4 | NEVER DROP |

FIG.7
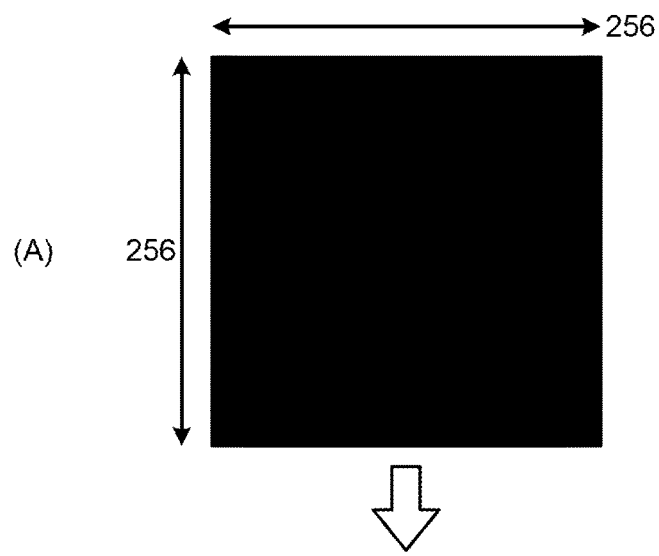
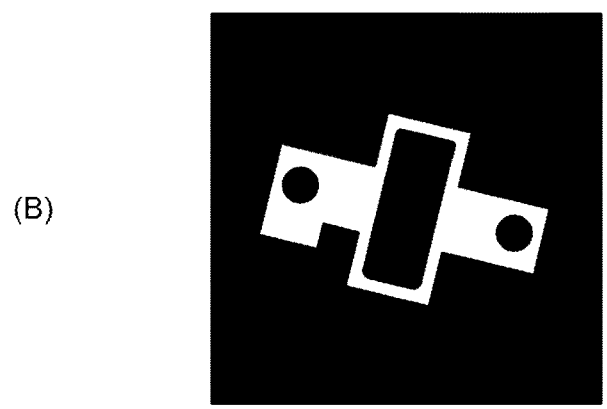
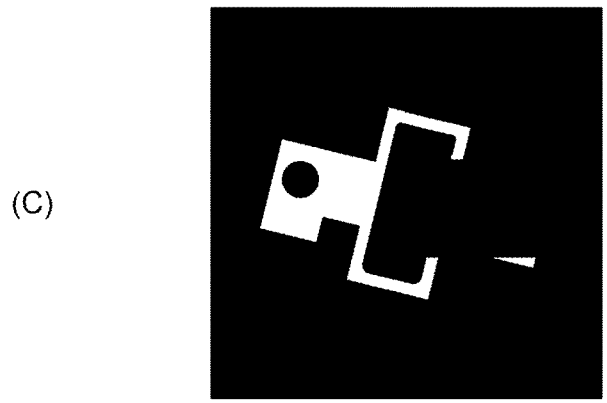

[16×16]   AVERAGE SCORE

WEIGHTING 100%    +    WEIGHTING 75%

METHOD AND APPARATUS FOR DETERMINING ARRANGEMENT POSITION OF LEADER LINE

CROSS-REFERENCE TO RELATED APPLICATION(S)

This application is based upon and claims the benefit of priority of the prior Japanese Patent Application No. 2014-228973, filed on Nov. 11, 2014, the entire contents of which are incorporated herein by reference.

FIELD

The embodiments discussed herein are related to a method for determining an arrangement position of a leader line, and a leader line arrangement position determining apparatus.

BACKGROUND

Various documents using leader lines have been created. In design or production engineering sectors of the manufacturing industry, for example, for the purpose of explaining parts constituting products and explaining how to assemble parts, documents that illustrate parts and describe explanations about parts such as assembly drawings, part drawings, exploded drawings, and assembly instruction manuals are created. In such a document, in order to indicate a part corresponding to an explanation, a leader line is attached to the part.

There are various kinds of techniques that arrange such a leader line in an easy-to-see manner. For example, there is a technique that arranges leader lines extending from parts so that they do not cross each other. Conventional technologies are described in Japanese Laid-open Patent Publication No. 06-83881, Japanese Laid-open Patent Publication No. 02-264367, Japanese Laid-open Patent Publication No. 2002-324085, Japanese Laid-open Patent Publication No. 2002-324086, and Japanese Laid-open Patent Publication No. 2003-330970, for example.

Although the conventional technologies can arrange leader lines so that they do not cross each other, correspondences between leader lines and parts may be difficult to understand. The conventional technologies do not determine with which position of a part as a starting position a leader line is drawn. Given this situation, for example, leader lines are drawn with the gravity center position of a three-dimensional model of a part generated by computer aided design (CAD), the first apex position on data of the three-dimensional model, or the like as a starting position. In this case, in an assembly model including a plurality of parts, the starting position of a leader line of a part may be hidden behind other parts, and a correspondence between the leader line and the part is difficult to understand.

SUMMARY

According to an aspect of an embodiment, when a three-dimensional CAD (Computer Aided Design) space in which an object is arranged is displayed from a designated viewpoint, a shape of the object displayed when viewed from the viewpoint is determined. Then, arranging one end of a leader line is arranged at a position determined from the determined shape of the object.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a diagram illustrating an overall configuration of a leader line arrangement position determining apparatus;

FIG. 2 is a diagram illustrating an example of a data structure of CAD data;

FIG. 7 is a diagram illustrating an example of a procedure of generation of the projected image;

DESCRIPTION OF EMBODIMENTS

Figures 3, 4:
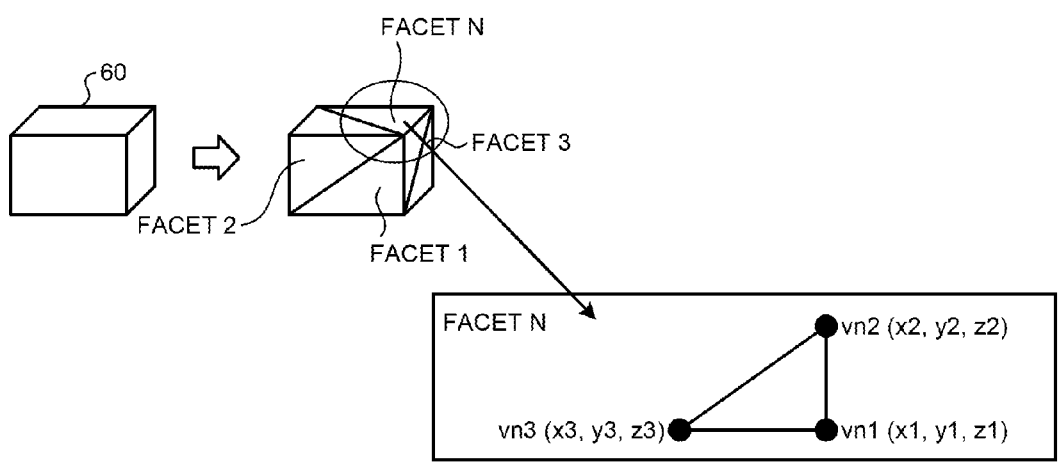
FIG. 3 is a diagram illustrating an example of a relation between the shape of a part and shape information.
FIG. 4 is a diagram illustrating an example of data stored in the shape information.

Preferred embodiments of the present invention will be explained with reference to accompanying drawings. The embodiments do not limit the present invention. The embodiments can be combined appropriately to the extent that processing contents are not contradictory.

[a] First Embodiment

A leader line arrangement position determining apparatus 10 according to a first embodiment will be explained. FIG.

1 is a diagram illustrating an overall configuration of a leader line arrangement position determining apparatus. The leader line arrangement position determining apparatus 10 is an apparatus that supports arrangement of leader lines when documents about parts are created. The leader line arrangement position determining apparatus 10 is, for example, a computer such as a personal computer and a server computer. The leader line arrangement position determining apparatus 10 may be implemented as one computer or can be implemented as a cloud including a plurality of computers. The present embodiment explains a case in which the leader line arrangement position determining apparatus 10 is one computer as an example. The leader line arrangement position determining apparatus 10 may be a design apparatus on which design software that supports design by a designer such as a computer aided design (CAD) apparatus operates. As illustrated in FIG. 1, the leader line arrangement position determining apparatus 10 includes an input unit 20, a display unit 21, a communication interface (I/F) unit 22, a storage unit 23, and a controller 24.

The input unit 20 is an input device that receives input of various kinds of information. Examples of the input unit 20 include input devices that receive operation input of a mouse, a keyboard, or the like. The input unit 20 receives various kinds of information. The input unit 20, for example, receives input of various kinds of operations about prediction of faulty locations. The input unit 20 receives operation input from a user and inputs operation information indicating received operation contents to the controller 24.

The display unit 21 is a display device that displays various kinds of information. Examples of the display unit 21 include display devices such as a liquid crystal display (LCD) and a cathode ray tube (CRT). The display unit 21 displays various kinds of information. The display unit 21, for example, displays various kinds of screens such as a screen that arranges an object of an assembly model including a plurality of parts in a three-dimensional CAD space described below.

The communication I/F unit 22 is an interface that performs communication control with another apparatus. The communication I/F unit 22 transmits and receives various kinds of information to and from the other apparatus via a network (not illustrated). The communication I/F unit 22, for example, receives CAD data 30 described below from the other apparatus. Examples of the communication I/F unit 22 include a network interface card such as a LAN card. The leader line arrangement position determining apparatus 10 may acquire information such as the CAD data 30 via a storage medium such as a memory card. The CAD data 30 may be input from the input unit 20.

The storage unit 23 is a storage apparatus such as a hard disk, a solid state drive (SSD), and an optical disc. The storage unit 23 may be a data-rewritable semiconductor memory such as a random access memory (RAM), a flash memory, a non volatile static random access memory (NVS-RAM).

The storage unit 23 stores therein an operating system (OS) and various kinds of programs executed by the controller 24. The storage unit 23, for example, stores therein a program that executes various kinds of processing for determining arrangement positions of leader lines described below. The storage unit 23 stores therein various kinds of data used in the programs executed by the controller 24. The storage unit 23, for example, stores therein the CAD data 30, note information 31, and leader line position information 32.

The CAD data 30 is design data by three-dimensional CAD. The CAD data 30 stores therein various kinds of design information such as three-dimensional coordinate information indicating shapes of parts with respect to an assembly model including a plurality of parts.

FIG. 2 is a diagram illustrating an example of a data structure of CAD data. The CAD data 30 stores therein various kinds of part-related attribute information for each part constituting the assembly model. As illustrated in FIG. 2, the CAD data 30, for example, stores therein, as the part-related attribute information, a part number, origin coordinates of a part, a local coordinate system of a part, and shape information. The part number is identification information attached to each part constituting the assembly model. Each part is attached with an individual part number for identifying each. The item of the part number stores therein part numbers attached to the parts. The identification information of the part may be a part name. The origin coordinates of a part are information indicating coordinates used as an origin of part-related position information in the coordinates of the three-dimensional CAD space. The origin coordinates of a part may be different from part to part, or a common origin may be used for the parts. The local coordinate system of a part is information indicating a coordinate system used for determining the position of a part in the three-dimensional CAD space based on the origin coordinates of a part for each part. The local coordinate system of a part may be different from part to part, or a common coordinate system may be used for the parts. The shape information is information indicating the shape of a part in the local coordinate system of a part based on the origin coordinates of a part for each part. It is assumed that the CAD data 30 according to the present embodiment stores therein the shape of a part through a combination of triangular facets. The shape information stores therein apex coordinates of respective triangular facets constituting the shape of a part and normal vectors of the planes of the respective triangles.

FIG. 3 is a diagram illustrating an example of a relation between the shape of a part and the shape information. As to a part 60 having a rectangular parallelepipedal outer shape, for example, the outer shape thereof is defined by a combination of triangular facet 1 to facet N. As to triangular facet N, for example, the position thereof in the three-dimensional CAD space is defined by three dimensional coordinates (x1, y1, z1), (x2, y2, z2), and (x3, y3, z3) of three apexes and the normal vector of facet N.

FIG. 4 is a diagram illustrating an example of data stored in the shape information. The shape information of the CAD data 30 stores therein, for each of triangular facet 1 to facet N constituting the part, the apex coordinates of the triangle and the normal vector of the plane of the triangle.

Referring back to FIG. 1, the note information 31 is data that stores therein information on notes. The note information 31, for example, stores therein information on notes such as parts with which notes are associated and note contents.

Figures 5, 6:
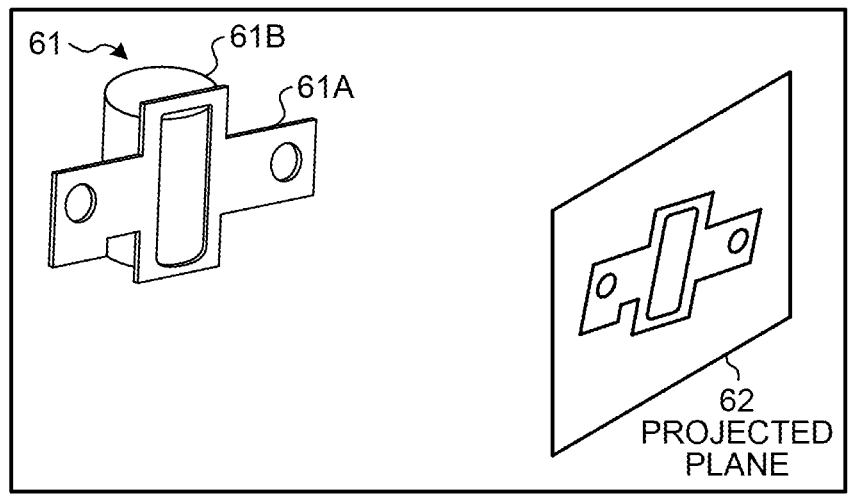
FIG. 5 is a diagram illustrating an example of note information.
FIG. 6 is a diagram illustrating an example of a projected image.

FIG. 5 is a diagram illustrating an example of the note information. The note information 31 includes items of a part number and a comment. The item of the part number is an area that stores therein part numbers of parts with which notes are associated. The item of the comment is an area that stores therein note contents. The example in FIG. 5 registers a note of "firmly connect" for a part with a part number of "2." Information on the notes of these parts may be registered by a creator when a document is created. The information on the notes of the parts may be registered by a designer of a part or a person in charge who manages production using a tool. A tool for designers and a tool for a production preparation sector implement contents to be used as notes and a function of registration as a standard function. When the note information 31 is thus registered in advance, the note information 31 is received from another apparatus together with the CAD data 30.

Referring back to FIG. 1, the leader line position information 32 is data that stores therein information on leader lines for use in the respective notes. The leader line position information 32, for example, stores therein information on part numbers of parts with which leader lines are associated and information on starting positions of leader lines.

The controller 24 is a device that controls the leader line arrangement position determining apparatus 10. The controller 24 can be an electronic circuit such as a central processing unit (CPU) and a micro processing unit (MPU) or an integrated circuit such as an application specific integrated circuit (ASIC) and a field programmable gate array (FPGA). The controller 24 includes an internal memory for storing therein programs that define various kinds of processing procedures and control data and executes various processing using them. Various kinds of programs operate, thereby causing the controller 24 to function as various kinds of processing units. The controller 24, for example, includes a display controller 40, a receiving unit 41, and a note generating unit 42.

The display controller 40 performs display control on various kinds of information to the display unit 21. The display controller 40, for example, performs control to display an image of an assembly model including a plurality of parts viewed from a designated viewpoint in the three-dimensional CAD space based on the CAD data 30.

The receiving unit 41 receives various kinds of operations related to generation of notes. The receiving unit 41, for example, receives designation of a viewpoint position for displaying the assembly model. When a document such as an explanation of a part constituting a product and an explanation about how to assemble a part is created, for example, a user designates a viewpoint position from which the part is easily explained. The user, for example, designates a viewpoint position from which the part explained in the document is easily determined or a viewpoint position corresponding to the explanation. The display controller 40 displays an image of the assembly model viewed from the designated viewpoint in the three-dimensional CAD space.

The receiving unit 41, for example, receives registration of information on notes. The receiving unit 41, for example, receives parts with which notes are associated and note contents. The user, for example, registers the parts with which notes are associated and the note contents. The receiving unit 41 stores the received information on notes in the note information 31.

The receiving unit 41, for example, receives instructions of arrangement of notes. The receiving unit 41, for example, receives an instruction of arrangement of a note for each part on an image of the designated viewpoint position.

The note generating unit 42 generate notes. The note generating unit 42, for example, generates a leader line that connects between a note and a part corresponding to the note in accordance with the instruction received by the receiving unit 41. The note generating unit 42 includes a note arranging unit 50, a determining unit 51, and a leader line arranging unit 52.

The note arranging unit 50 arranges notes in an image. The note arranging unit 50, for example, displays note contents of respective parts based on the note information 31. When a part is displayed in a received viewpoint image, for example, the note arranging unit 50 displays a box that displays the note contents of the displayed part. The note may be, for example, what is called a balloon in which the identification information of the part such as the part number is displayed in a circle or the like. In the present embodiment, the note includes the balloon.

The determining unit 51 performs various kinds of determinations. The determining unit 51, for example, determines the shape of a part object displayed when, for each part constituting an assembly model, the part is viewed from the designated viewpoint in the three-dimensional CAD space. The determining unit 51, for example, generates a projected image obtained by projecting a part of the assembly model in the three-dimensional CAD space in a viewpoint direction based on the CAD data 30.

FIG. 6 is a diagram illustrating an example of the projected image. FIG. 6 illustrates an assembly model 61 including two parts 61A and 61B. The determining unit 51 virtually arranges a projected plane 62 that is perpendicular to the assembly model 61 at the viewpoint position and generates a projected image obtained by projecting an area of the part visible from the viewpoint side onto the projected plane 62.

FIG. 7 is a diagram illustrating an example of a procedure of generation of the projected image. The determining unit 51 prepares a bitmap of a specific size for performing image processing. A background color is set to black (FIG. 7(A)). The determining unit 51 projects a target part onto the bitmap with the projected part as white (FIG. 7(B)). The determining unit 51 projects other parts closer to the viewpoint than the target part in black (FIG. 7(C)). With this operation, pixels of part of the part visible from the viewpoint are white, whereas pixels of invisible part thereof are black.

The leader line arranging unit 52 arranges leader lines. The leader line arranging unit 52, for example, arranges one end of a leader line at a position determined from the shape of a part object determined by the projected image. The leader line arranging unit 52, for example, arranges the one end of the leader line at a position avoiding a boundary of the determined shape of the part object. The leader line arranging unit 52, for example, arranges the one end of the leader line on a plane displayed widest of the determined shape of the part object.

The leader line arranging unit 52, for example, generates, for each part, a rectangular part image that arranges the part at the center and enlarges or reduces the part to a certain size from the projected image. The leader line arranging unit 52, for example, generates a part image in which the part is enlarged or reduced so that either larger one of the vertical size or the lateral size of the part has, in an image of 256×256 pixels, a size of 80% of the image, for example.

Figure 8:
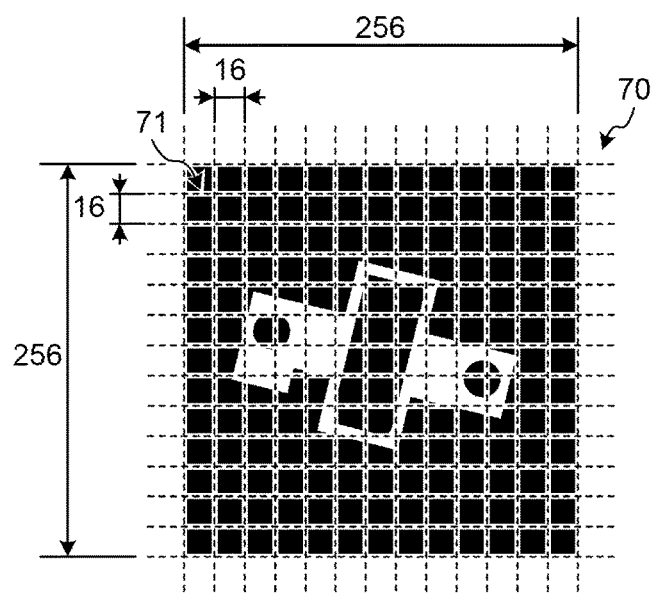
FIG. 8 is a diagram illustrating an example of division of a part image.

The leader line arranging unit 52 divides the part image into areas of a certain first size. The leader line arranging unit 52, for example, divides the part image of 256×256 pixels into divided areas each of which has a size of 16×16 pixels. FIG. 8 is a diagram illustrating an example of division of the part image. In the example in FIG. 8, a part image 70 of 256×256 pixels is divided into 256 divided areas 71 each of which has a size of 16×16 pixels.

Figure 9:
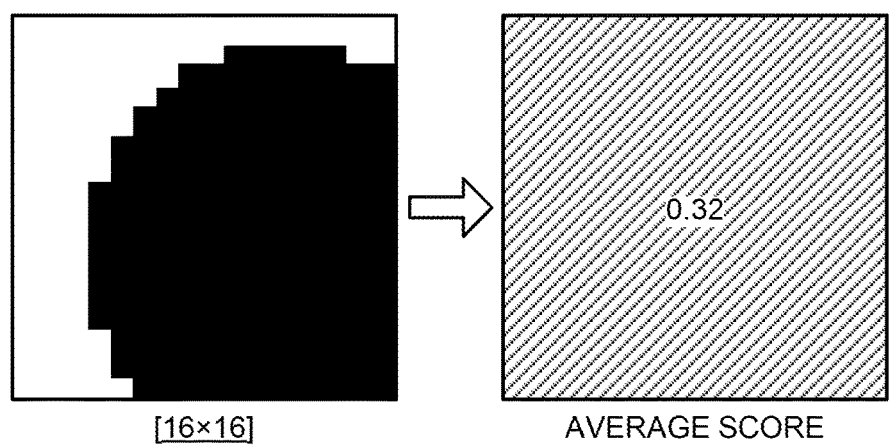
FIG. 9 is a diagram illustrating an example of calculation of an average score.
Figure 10:
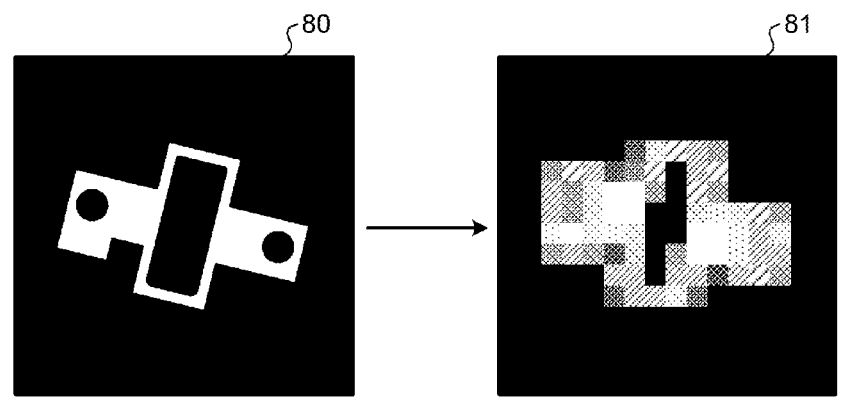
FIG. 10 is a diagram illustrating an example of indicating an average score for each divided area of the projected image.

The leader line arranging unit 52 determines a proportion occupied by the part for each of the divided areas. The leader line arranging unit 52, for example, calculates an average score with a white pixel being 1 and a black pixel being 0 for each divided area. FIG. 9 is a diagram illustrating an example of the calculation of the average score. In the example in FIG. 9, the average score is calculated to be "0.32" with the white pixel being 1 and the black pixel being 0 for the divided area 71. In the divided area, a higher average score means a larger area occupied by the part. FIG. 10 is a diagram illustrating an example of indicating the average score for each divided area of the projected image. The example in FIG. 10 displays a projected image 80 and an image 81 obtained by displaying the average values of the divided areas of the projected image 80 as pixel values of all pixels of the divided areas in gray scale. In the image 81, because a larger white part in the projected image 80 has a higher average value of the divided area, the divided area is close to white.

The leader line arranging unit 52 determines whether there is only one divided area the average value of which is the highest in the part image. If there is only one divided area the average value of which is the highest, the leader line arranging unit 52 determines the divided area the average value of which is the highest to be a drawing area of a leader line. With this operation, for example, a divided area the proportion occupied by the part of which is the highest and that is close to white is determined to be the drawing area of the leader line.

In contrast, if there are, not only one, a plurality of divided areas the average value of which is the highest, the leader line arranging unit 52 determines to be the drawing area with surrounding divided areas also added. The leader line arranging unit 52, for example, for each of the divided areas the average value of which is the highest, adds the average values of the surrounding divided areas to the average value of the divided area by weighting to determine a score.

Figure 11:
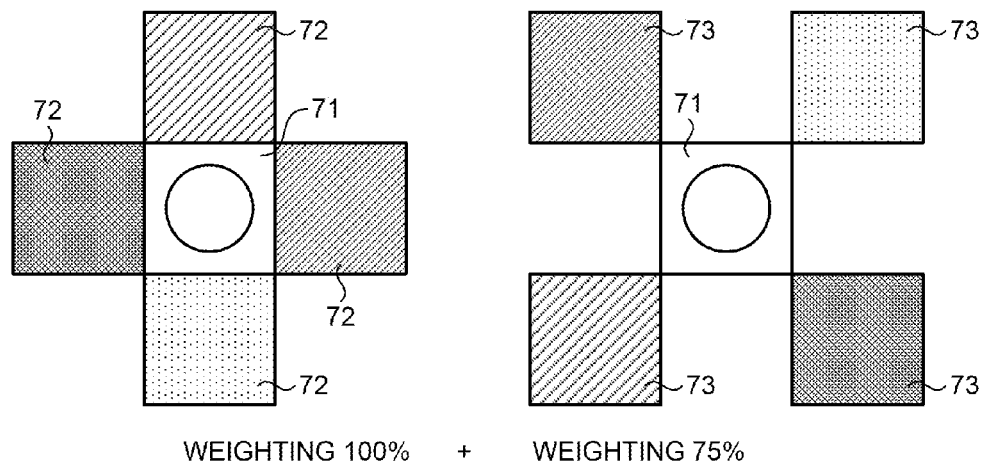
FIG. 11 is a diagram illustrating an example of weighting.

FIG. 11 is a diagram illustrating an example of weighting. In the example in FIG. 11, the leader line arranging unit 52 adds the respective average scores of divided areas 72 adjacent to (above, below, to the left of, and to the right of) the divided area 71 the average value of which is the highest as they are. The leader line arranging unit 52 adds respective values obtained by multiplying the respective average scores of divided areas 73 obliquely adjacent to (to the upper left of, to the lower left of, to the upper right of, and to the lower right of) the divided area 71 the average value of which is the highest by 0.75. The weighting in FIG. 11 is an example, and that is not limiting.

The leader line arranging unit 52 compares the scores of the divided areas the average value of which is the highest with each other. If there is one divided area the average value of which is the highest, the leader line arranging unit 52 determines the divided area the score of which is the highest to be the drawing area of the leader line. In contrast, if there are a plurality of divided areas the score of which is the highest, the leader line arranging unit 52 determines to be the drawing area with further surrounding areas of the surrounding areas also added. The leader line arranging unit 52, for example, for each of the divided areas the average value of which is the highest, adds the average values of the further surrounding divides areas of the surrounding areas to the average value of the divided area by weighting to determine a score. In the present embodiment, the respective average values of the divided areas adjacent to (above, below, to the left of, and to the right of) the surrounding areas are added as they are. The average values of the divided areas obliquely adjacent to the surrounding areas may be added by weighting. The leader line arranging unit 52 repeats the addition of the average values of the surrounding areas by weighting until there is one divided area the score of which is the highest and determines the divided area the score of which is the highest to be the drawing area of the leader line. Such a comparison with the surrounding areas also added can extract the divided area that is the whitest and the surrounding areas of which are white.

The leader line arranging unit 52 further divides the divided area determined to be the drawing area. The leader line arranging unit 52, for example, divides the divided area into areas of a certain second size. The leader line arranging unit 52, for example, divides the divided area of 16×16 pixels into sectioned areas each of which has a size of 4×4 pixels.

The leader line arranging unit 52 calculates an average score with a white pixel being 1 and a black pixel being 0 for each of the sectioned areas. The leader line arranging unit 52 determines whether there is only one sectioned area the average value of which is the highest in the divided area determined to be the drawing area. If there is only one sectioned area the average value of which is the highest, the leader line arranging unit 52 determines a drawing pixel of the leader line from within the sectioned area the average value of which is the highest. The leader line arranging unit 52, for example, searches the pixels of the sectioned area the average value of which is the highest from upper left and determines a pixel that is not black appearing first to be the drawing pixel. With this operation, for example, a white pixel in a sectioned area the proportion occupied by the part of which is the highest is determined to be the drawing pixel.

In contrast, if there are, not only one, a plurality of sectioned areas the average value of which is the highest, the leader line arranging unit 52 determines to be the drawing area with surrounding areas also added. The leader line arranging unit 52, for example, for each of the sectioned areas the average value of which is the highest, adds the average values of the surrounding sectioned areas to the average value of the sectioned area by weighting to determine a score. The leader line arranging unit 52, for example, adds the respective average scores of sectioned areas adjacent to (above, below, to the left of, and to the right of) the sectioned area the average value of which is the highest as they are. The leader line arranging unit 52 adds respective values obtained by multiplying the respective average scores of sectioned areas obliquely adjacent to (to the upper left of, to the lower left of, to the upper right of, and to the lower right of) the sectioned area the average value of which is the highest by 0.75. The weighting is an example, and that is not limiting.

Figures 12, 13:
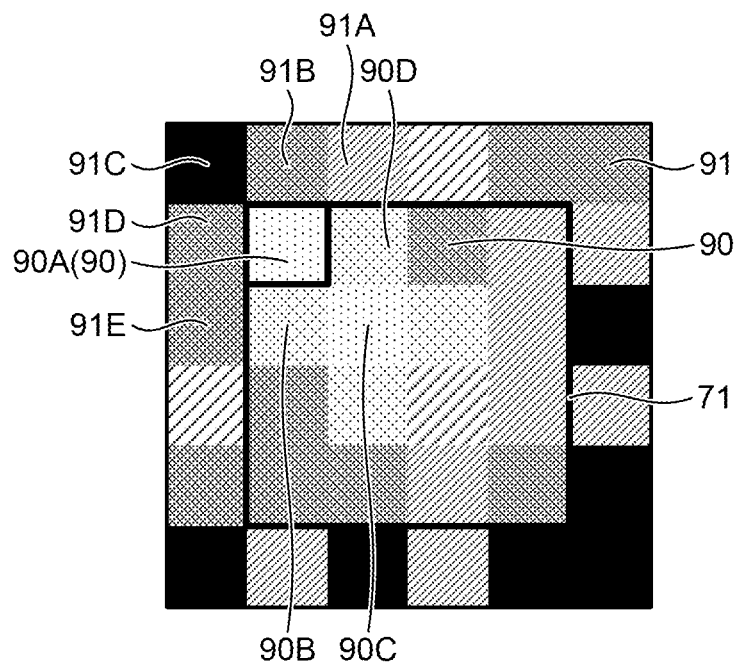
FIG. 12 is a diagram illustrating an example of a result of weighting.
FIG. 13 is a diagram illustrating an example of a search rule.

FIG. 12 is a diagram illustrating an example of a result of weighting. The example in FIG. 12 illustrates the divided area 71 divided into 16 sectioned areas 90 and sectioned areas 91 around the divided area 71. When a sectioned area 90A is the sectioned area the average value of which is the highest, for example, the leader line arranging unit 52 adds the respective average values of sectioned areas 90B through 90D and 91A through 91E around the sectioned area 90A to the average score of the sectioned area 90A by weighting to determine a score. In the example in FIG. 12, a sectioned area having a higher score is illustrated to be closer to white.

The leader line arranging unit 52 compares the scores of the sectioned areas the average value of which is the highest with each other. If there is one sectioned area the average value of which is the highest, the leader line arranging unit 52 determines the sectioned area the score of which is the highest to be the drawing area of the leader line. In contrast, if there are a plurality of sectioned areas the score of which is the highest, the leader line arranging unit 52 determines to be the drawing area with further surrounding areas of the surrounding areas also added. The leader line arranging unit 52, for example, for each of the sectioned areas the score of which is the highest, adds the average values of the further surrounding sectioned areas of the surrounding areas to the average value of the sectioned area by weighting to determine a score. In the present embodiment, the respective average values of the sectioned areas adjacent to (above, below, to the left of, and to the right of) the surrounding areas are added as they are. The average values of the sectioned areas obliquely adjacent to the surrounding areas may be added by weighting. The leader line arranging unit 52 repeats the addition of the average values of the surrounding areas by weighting until there is only one sectioned area the score of which is the highest and determines the sectioned area the score of which is the highest to be the drawing area of the leader line. Such a comparison with the surrounding areas also added can extract the sectioned area that is the whitest and the surrounding areas of which are whiter in the divided area.

The leader line arranging unit 52 determines the drawing pixel of the leader line from within the sectioned area determined to be the drawing area in accordance with a certain rule. The leader line arranging unit 52, for example, searches the sectioned area in accordance with a certain search rule and determines a pixel that is not black appearing first in the sectioned area the score of which is the highest to be the drawing pixel.

FIG. 13 is a diagram illustrating an example of the search rule. FIG. 13 illustrates numbers indicating an order of searching the pixels within the sectioned area. In the example in FIG. 13, respective lateral lines of the pixels within the sectioned area are searched in order from above and from left to right. With this operation, in the section area the score of which is the highest, the pixel present at the most upper left within the sectioned area is determined to be the drawing pixel. The search order in FIG. 13 is an example, and that is not limiting.

The leader line arranging unit 52 determines the coordinates of a position on the part corresponding to the drawing pixel within the part image in the three-dimensional CAD space.

Figure 14:
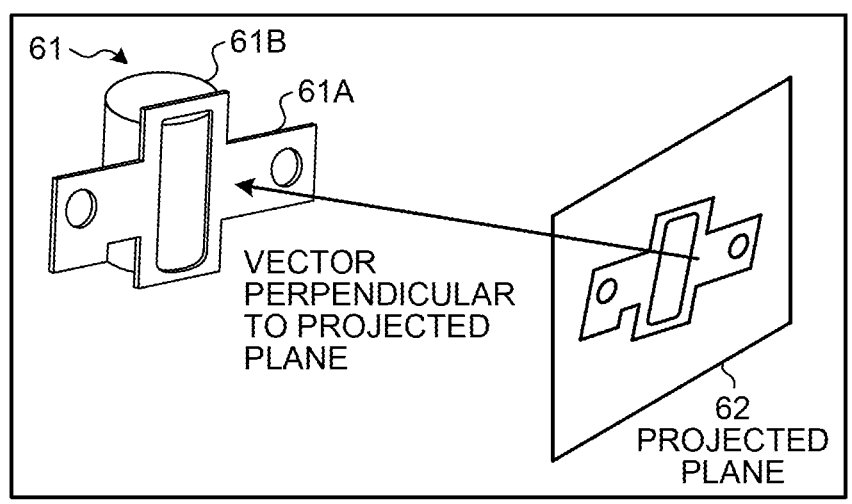
FIG. 14 is a diagram illustrating an example of the coordinates of a position on a part corresponding to a drawing pixel.

FIG. 14 is a diagram illustrating an example of the coordinates of the position on the part corresponding to the drawing pixel. The leader line arranging unit 52, for example, determines the coordinates of a point of intersection at which a vector perpendicular to the projected plane 62 from the position of the drawing pixel of the projected plane 62 crosses the part 61A in the three-dimensional CAD space and determines the coordinates of the point of intersection to be the coordinates of a drawing position. The leader line arranging unit 52 stores the coordinates of the drawing position in the leader line position information 32 for each part. By thus storing the coordinates of the drawing position in the three-dimensional CAD space, the leader line can be displayed so that a correspondence with the part is easily understood by arranging one end of the leader line in accordance with the coordinates of the drawing position even when the viewpoint moves to some extent.

The leader line arranging unit 52 arranges a leader line that associates a part with a note for each part based on the leader line position information 32. The leader line arranging unit 52, for example, when there is information displayed with respect to a part, associates the other end of the leader line with the information. The leader line arranging unit 52, for example, when a part is displayed in a received viewpoint image, arranges a leader line that associates the displayed part with the note of the part. The leader line arranging unit 52, for example, reads the coordinates of the drawing position of the displayed part from the leader line position information 32, determines the drawing position of the leader line when viewed from the designated viewpoint in the three-dimensional CAD space, and arranges one end of the leader line. The leader line arranging unit 52 arranges the other end of the leader line the one end of which is arranged at the displayed part at the note of the part and associates the part with the note.

Figure 15:
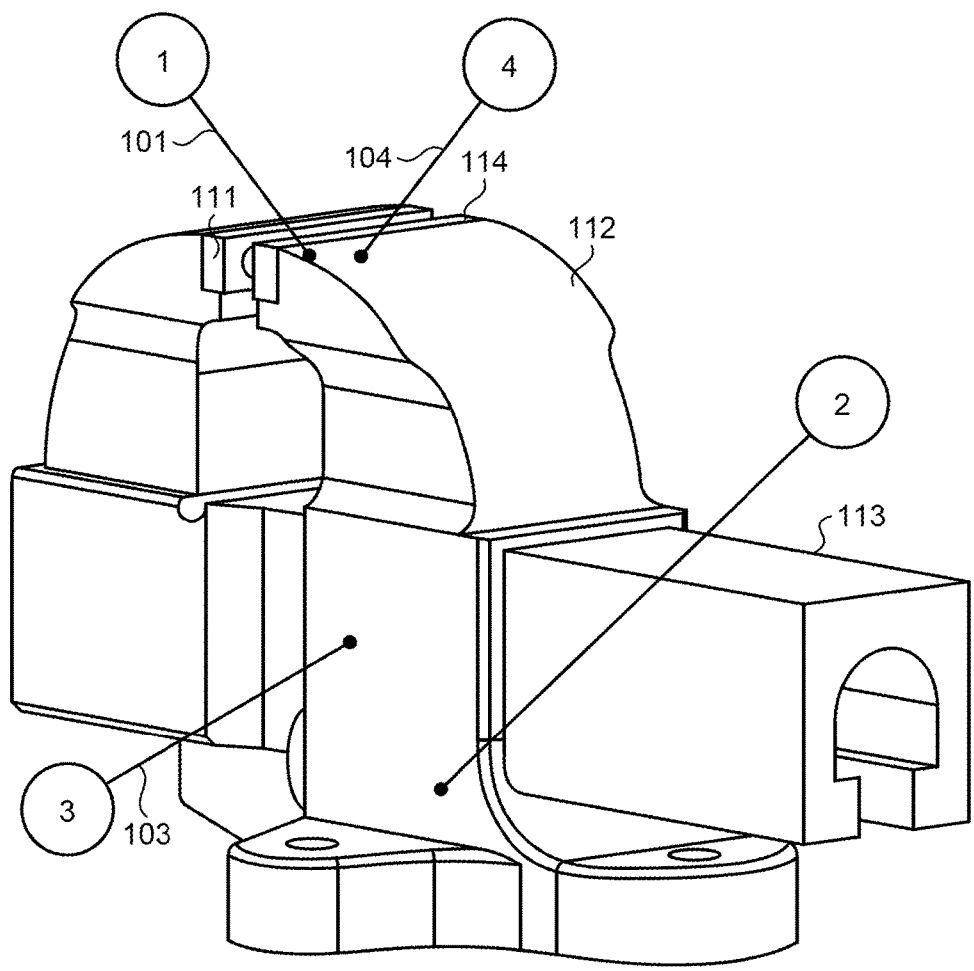
FIG. 15 is a diagram illustrating an example of arranging notes and leader lines of parts by a conventional technology.

An example of arranging notes and leader lines of parts will be illustrated. FIG. 15 is a diagram illustrating an example of arranging notes and leader lines of parts by a conventional technology. In the example in FIG. 15, balloons with a number of "1" to "4" indicating the parts are displayed as the notes, and the leader lines that connect between the respective balloons and the corresponding parts are arranged. In the example in FIG. 15, the end of the leader line on the part side is drawn out of the gravity center position of the part. In FIG. 15, a correspondence with the part indicated by the leader line may be difficult to understand. For example, even though a leader line 101 of the number "1" is associated with a part 111, it looks like being associated with a part 112. Even though a leader line 103 of the number "3" is associated with a part 113, it looks like being associated with the part 112. Even though a leader line 104 of the number "4" is associated with a part 114, it looks like being associated with the part 112.

Figure 16:
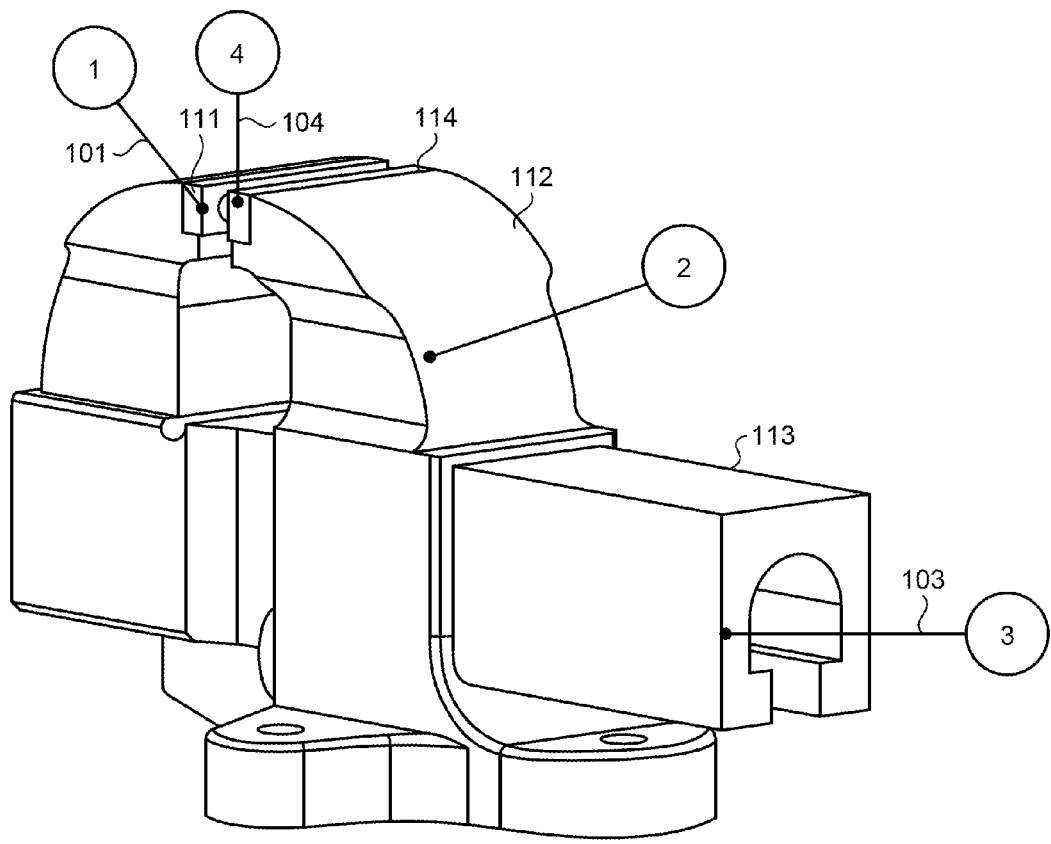
FIG. 16 is a diagram illustrating an example of arranging the notes and the leader lines of the parts by the present embodiment.

FIG. 16 is a diagram illustrating an example of arranging the notes and the leader lines of the parts by the present embodiment. Also in the example in FIG. 16, the balloons with a number of "1" to "4" indicating the parts are displayed as the notes, and the leader lines that connect between the respective balloons and the corresponding parts are arranged. In the example in FIG. 16, the correspondence with the part indicated by the leader line can be displayed in an easy-to-understand manner. For example, the leader line 101 of the number "1" is associated with the part 111. The leader line 103 of the number "3" is associated with the part 113. The leader line 104 of the number "4" is associated with the part 114.

Thus, the leader line arrangement position determining apparatus 10 according to the present embodiment can arrange a leader line so that a correspondence with a part is easily understood.

Figure 17:
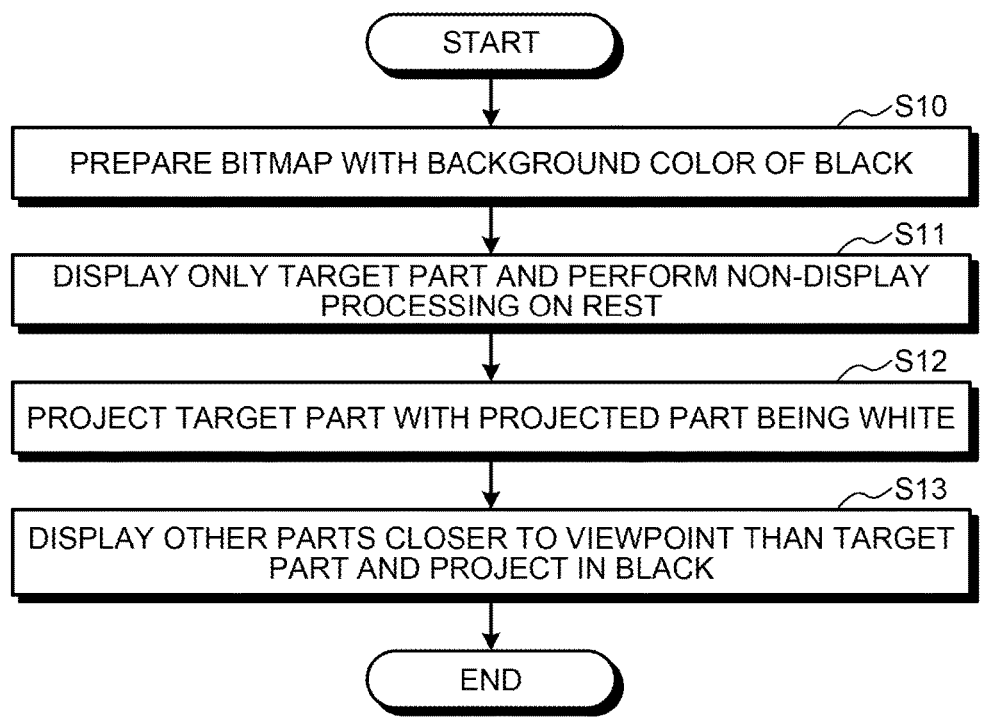
FIG. 17 is a flowchart illustrating an example of a procedure of shape determining processing.

Next, procedures of various kinds of processing the leader line arrangement position determining apparatus 10 according to the present embodiment uses for determining arrangement positions of leader lines will be explained. First, shape determining processing by which the leader line arrangement position determining apparatus 10 determines the shape of a part object will be described. FIG. 17 is a flowchart illustrating an example of a procedure of the shape determining processing.

As illustrated in FIG. 17, the determining unit 51 prepares a bitmap with a background color of black of a specific size for performing image processing (S10). The determining unit 51 displays only a target part at which a leader liner is arranged and does not display other parts (S11). The determining unit 51 projects the target part onto the bitmap with the projected part as white (S12). The determining unit 51 projects the other parts closer to the viewpoint than the target part in black (S13), and the processing ends.

Figure 18:
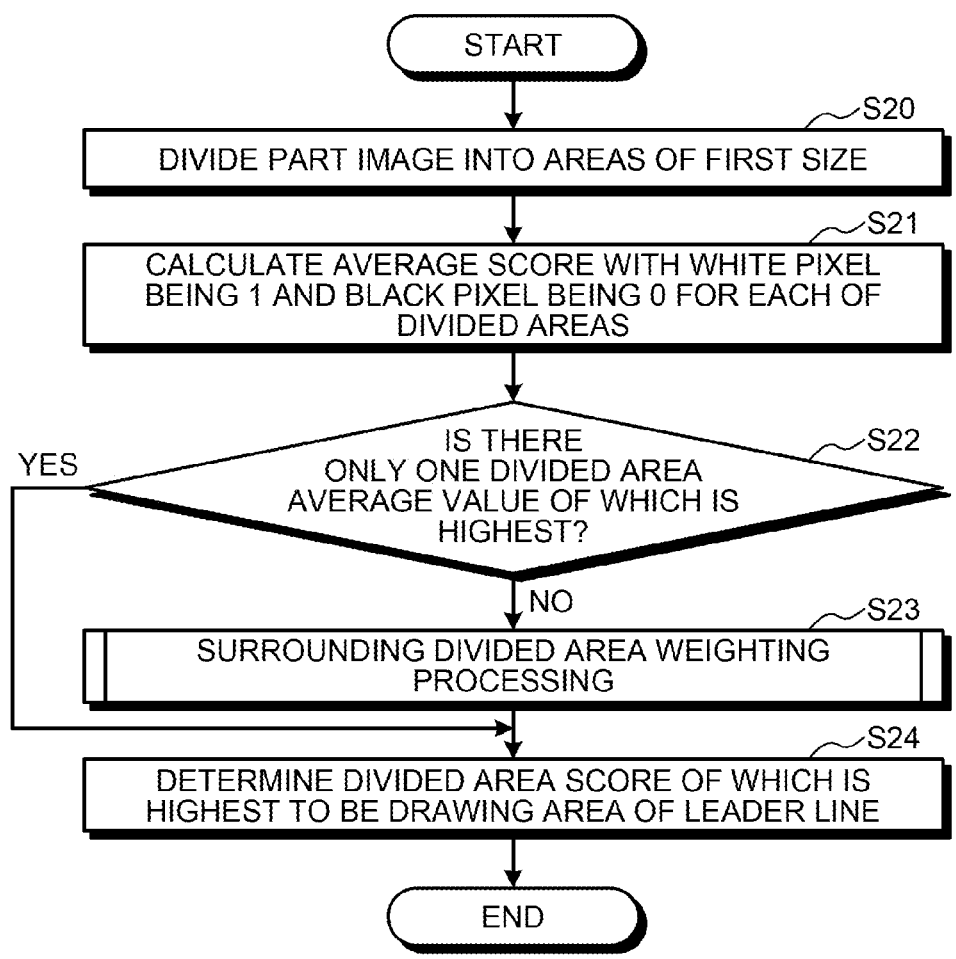
FIG. 18 is a flowchart illustrating an example of a procedure of divided area determining processing.

Next, divided area determining processing by which the leader line arrangement position determining apparatus 10 determines a divided area as a drawing area of a leader line will be explained. FIG. 18 is a flowchart illustrating an example of the divided area determining processing.

As illustrated in FIG. 18, the leader line arranging unit 52 divides a part image into areas of the first size (S20). The leader line arranging unit 52, for example, divides the part image of 256×256 pixels into divided areas each of which has a size of 16×16 pixels.

The leader line arranging unit 52 calculates an average score with a white pixel being 1 and a black pixel being 0 for each of the divided areas (S21). The leader line arranging unit 52 determines whether there is only one divided area the average value of which is the highest in the part image (S22). If there are a plurality of divided areas the average value of which is the highest (No at S22), the leader line arranging unit 52 performs surrounding divided area weighting processing described below (S23), and the process shifts to S24 described below. In contrast, if there is only one divided area the average value of which is the highest (Yes at S22), the process shifts to S24 described below.

The leader line arranging unit 52 determines the divided area the average value or score of which is the highest to be the drawing area of the leader line (S24), and the processing ends.

Figure 19:
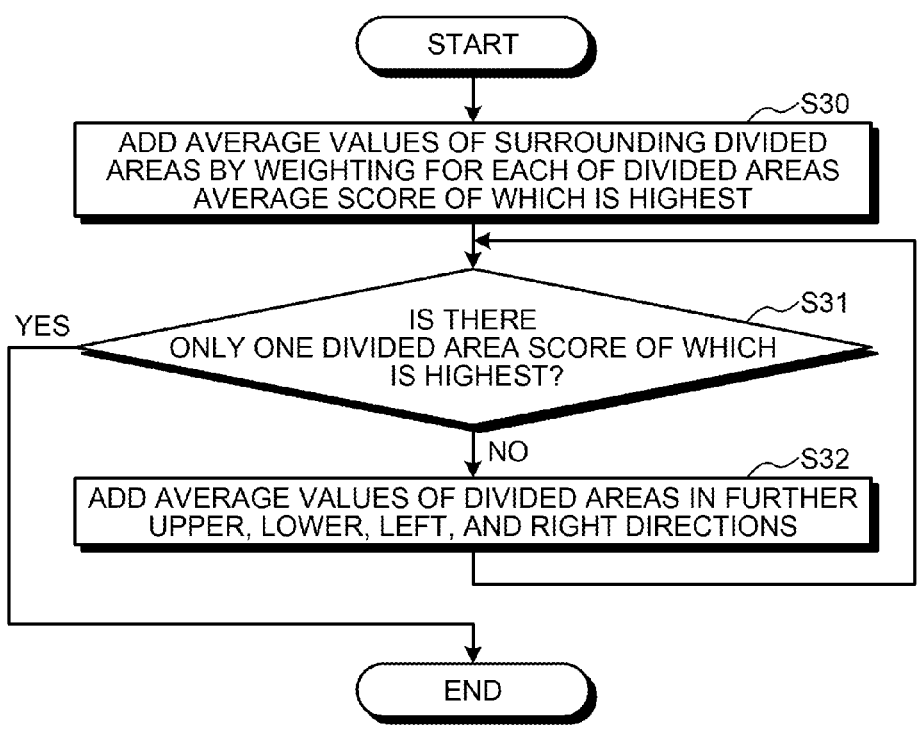
FIG. 19 is a flowchart illustrating an example of a procedure of surrounding divided area weighting processing.

Next, the surrounding divided area weighting processing by which the leader line arrangement position determining apparatus 10 adds the average values of surrounding divided areas by weighting will be explained. FIG. 19 is a flowchart illustrating an example of a procedure of the surrounding divided area weighting processing.

As illustrated in FIG. 19, the leader line arranging unit 52, for each of the divided areas the average value of which is the highest, adds the average values of the surrounding divided areas to the average value of the divided area by weighting to determine a score (S30). The leader line arranging unit 52, for example, adds the respective average values of the divided areas 72 adjacent to the divided area 71 the average value of which is the highest as they are. The leader line arranging unit 52 adds respective values obtained by multiplying the respective average scores of the divided areas 73 obliquely adjacent to the divided area 71 the average value of which is the highest by 0.75.

It is determined whether there is only one divided area the score of which is the highest (S31). If there are a plurality of divided areas the score of which is the highest (No at S31), the leader line arranging unit 52 adds the average values of further surrounding divided areas by weighting for each of the divided areas the average value of which is the highest (S32), and the process shifts to S31. The leader line arranging unit 52, for example, adds the respective average values of the divided areas in the further upper, lower, left, and right directions with respect to the divided area the score of which is the highest as they are.

In contrast, if there is only one divided area the average value of which is the highest (Yes at S31), the process ends and shifts to S24.

Figure 20:
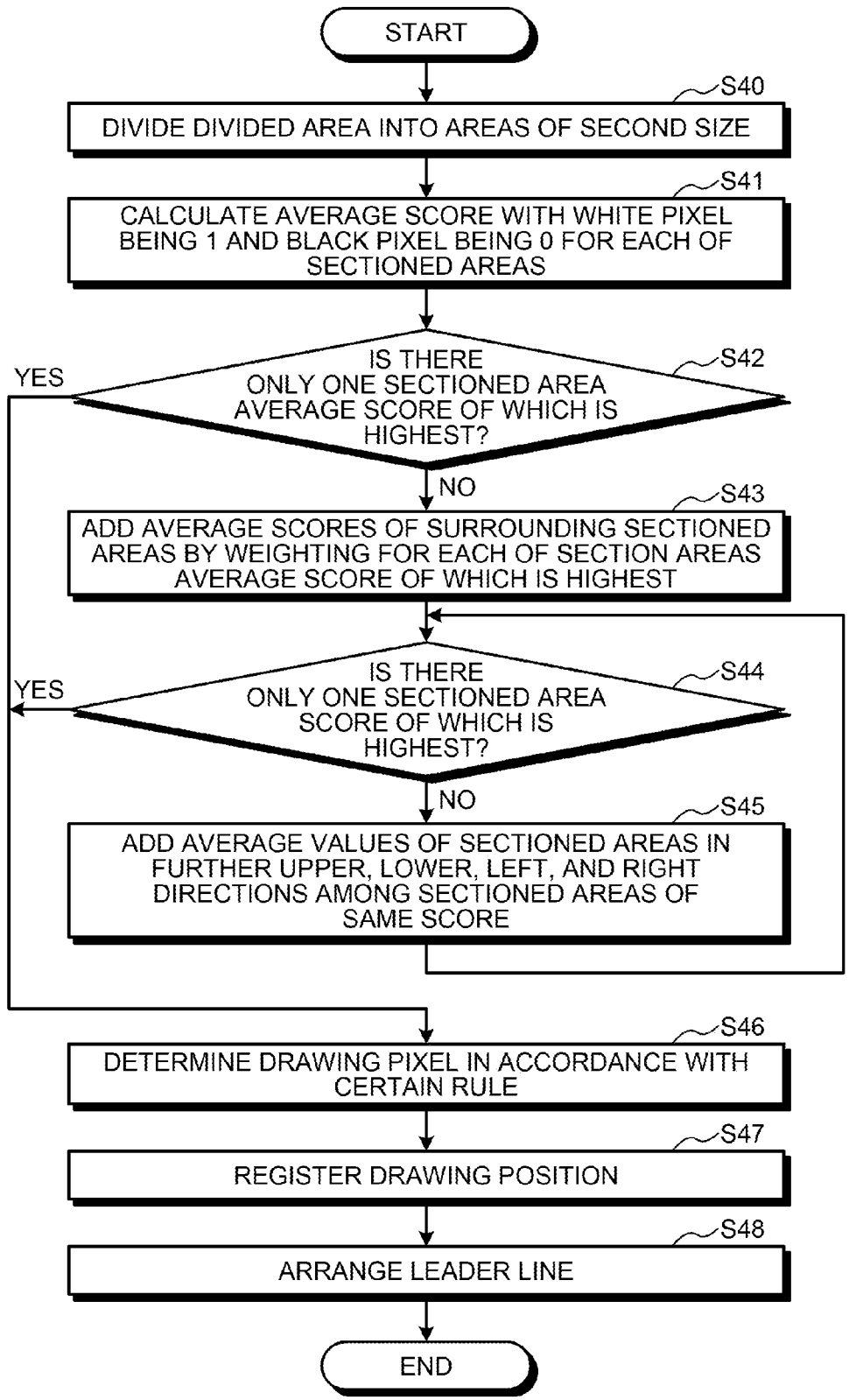
FIG. 20 is a flowchart illustrating an example of a procedure of sectioned area determining processing.

Next, sectioned area determining processing by which the leader line arrangement position determining apparatus 10 determines a sectioned area as a drawing area of a leader line will be explained. FIG. 20 is a flowchart illustrating an example of a procedure of the sectioned area determining processing.

As illustrated in FIG. 20, the leader line arranging unit 52 divides the divided area determined to be the drawing area into areas of the second size (S40). The leader line arranging unit 52, for example, divides the divided area of 16×16 pixels into sectioned areas each of which has a size of 4×4 pixels.

The leader line arranging unit 52 calculates an average score with a white pixel being 1 and a black pixel being 0 for each of the sectioned areas (S41). The leader line arranging unit 52 determines whether there is only one sectioned area the average value of which is the highest in the divided area determined to be the drawing area (S42). If there is only one sectioned area the average value of which is the highest (Yes at S42), the process shifts to S46 described below.

In contrast, if there are a plurality of sectioned areas the average value of which is the highest (No at S42), the leader line arranging unit 52 determines to be the drawing area with surrounding areas also added (S43). The leader line arranging unit 52, for example, adds the respective average values of sectioned areas adjacent to the sectioned area the average value of which is the highest as they are. The leader line arranging unit 52 adds respective values obtained by multiplying the respective average scores of sectioned areas obliquely adjacent to the sectioned area the average value of which is the highest by 0.75.

It is determined whether there is only one sectioned area the score of which is the highest (S44). If there are a plurality of sectioned areas the score of which is the highest (No at S44), the leader line arranging unit 52 adds the average values of further surrounding sectioned areas by weighting for each of the sectioned areas the average value of which is the highest (S45), and the process shifts to S44. The leader line arranging unit 52, for example, adds the respective average values of the sectioned areas in the further upper, lower, left, and right directions with respect to the sectioned area the score of which is the highest as they are.

In contrast, if there is only one sectioned area the average value of which is the highest (No at S44), the process shifts to S46 described below.

The leader line arranging unit 52 determines the drawing pixel of the leader line from within the sectioned area determined to be the drawing area in accordance with a certain rule (S46). The leader line arranging unit 52, for example, searches the sectioned area in accordance with a certain search rule and determines a pixel that is not black appearing first in the sectioned area the score of which is the highest to be the drawing pixel.

The leader line arranging unit 52 determines the coordinates of a position on the part corresponding to the drawing pixel within the part image in the three-dimensional CAD space and stores the coordinates of the drawing position in the leader line position information 32 (S47).

The leader line arranging unit 52 arranges a leader line that associates a part with a note for each part based on the leader line position information 32 (S48), and the processing ends.

Thus, when the three-dimensional CAD space in which the object is arranged is displayed from the designated viewpoint, the leader line arrangement position determining apparatus 10 determines the shape of the object displayed when viewed from the viewpoint. The leader line arrangement position determining apparatus 10 arranges one end of the leader line at the position determined from the determined shape of the object. With this operation, the other end of the leader line is not hidden behind other parts, and the leader line arrangement position determining apparatus 10 can arrange the leader line so that a correspondence with the part is easily understood.

The leader line arrangement position determining apparatus 10 arranges the other end of the leader line at the position avoiding a boundary of the determined shape of the object. With this operation, the other end of the leader line is not arranged at the boundary and is arranged on the part, and the leader line arrangement position determining apparatus 10 can arrange the leader line so that a correspondence with the part is easily understood.

The leader line arrangement position determining apparatus 10 arranges the other end of the leader line on the plane displayed widest of the determined shape of the object. With this operation, the other end of the leader line is arranged on the plane displayed widest of the shape of the part, and thus the leader line arrangement position determining apparatus 10 can cause the part to be indicated by the leader line in an easy-to-understand manner.

When there is information displayed with respect to an object, the leader line arrangement position determining apparatus 10 associates the other end of the leader line with the information. With this operation, the leader line arrangement position determining apparatus 10 can associate the object with the information displayed with respect to the object with the leader line.

[b] Second Embodiment

Although the embodiment related to the disclosed apparatus has been explained, the disclosed technology may be embodied with various kinds of different forms apart from the embodiment. Another embodiment included in the present invention will be explained below.

For example, although the embodiment explains a case of repeating the addition of the average values of the surrounding areas until the divided area or the sectioned area the score of which is the highest is determined, the disclosed apparatus is not limited thereto. When the divided area or the sectioned area the score of which is the highest is not determined even when the addition of the average values of the surrounding areas is repeated certain number of times, for example, the leader line arranging unit 52 may perform search in accordance with a certain search rule and determine the first divided area or sectioned area the score of which is the highest to be the drawing area. The leader line arranging unit 52, for example, may search respective lateral lines of the divided area or the sectioned area in order from above and from left to right and determine the divided area or the sectioned area present at the most upper left to be the drawing area of the leader line.

The illustrated components of the apparatuses are functionally conceptual and do not need to be physically configured as illustrated. In other words, specific states of distribution and integration of the apparatuses are not limited to the illustrated ones, and the whole or part thereof can be configured by distributing or integrating functionally or physically by any unit in accordance with various kinds of loads, use conditions, or the like. For example, the respective processing units of the display controller 40, the receiving unit 41, the note generating unit 42, the note arranging unit 50, the determining unit 51, and the leader line arranging unit 52 illustrated in FIG. 1 may appropriately be integrated or divided. The whole or part of processing functions performed by the respective processing units can be implemented by a CPU and a program that is analyzed and executed by the CPU or implemented as hardware by wired logic.

Leader Line Arrangement Position Determining Program

Figure 21:
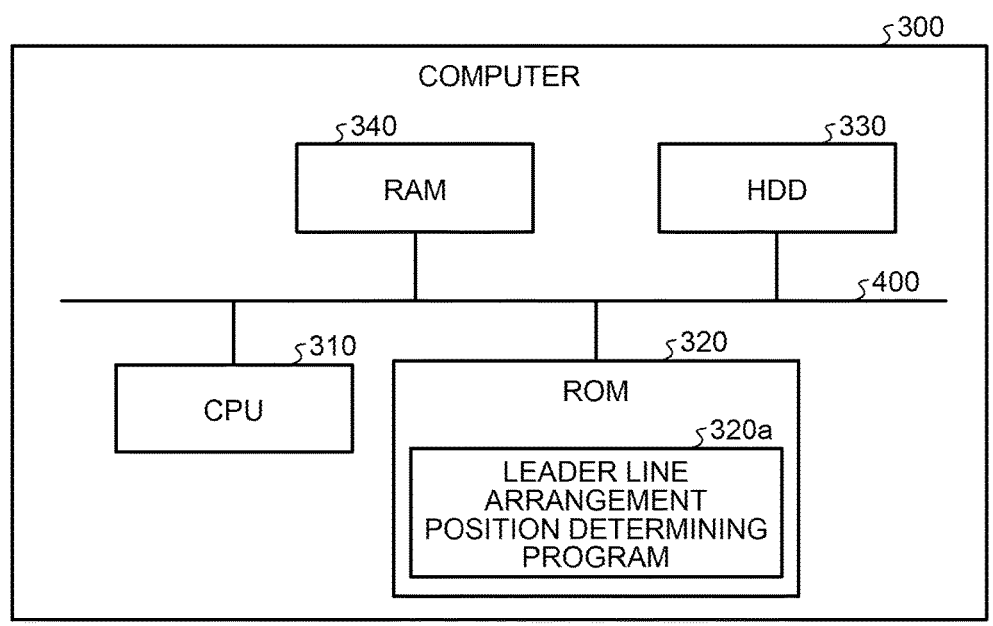
FIG. 21 is a diagram illustrating a computer that executes a leader line arrangement position determining program.

Various kinds of processing explained in the embodiment can also be implemented by executing a program prepared in advance by a computer system such as a personal computer and a workstation. An example of a computer system that executes a program having functions similar to the embodiment will be explained. FIG. 21 is a diagram illustrating a computer that executes a leader line arrangement position determining program.

As illustrated in FIG. 21, this computer 300 includes a CPU 310, a read only memory (ROM) 320, a hard disk drive (HDD) 330, and a random access memory (RAM) 340. These units 310 to 340 are connected via a bus 400.

The ROM 320 stores therein in advance a leader line arrangement position determining program 320a that exhibits functions similar to those of the respective processing unit of the embodiment. The leader line arrangement position determining program 320a is stored that exhibits functions similar to those of, for example, the display controller 40, the receiving unit 41, the note generating unit 42, the note arranging unit 50, the determining unit 51, and the leader line arranging unit 52 of the embodiment. The leader line arrangement position determining program 320a may appropriately be separated.

The HDD 330 stores therein various kinds of data. The HDD 330, for example, stores therein an OS and various kinds of data.

The CPU 310 reads the leader line arrangement position determining program 320a from the ROM 320 and executes the leader line arrangement position determining program 320a, thereby executing operations similar to those of the respective processing units of the embodiment. In other words, the leader line arrangement position determining program 320a executes operations similar to those of the display controller 40, the receiving unit 41, the note generating unit 42, the note arranging unit 50, the determining unit 51, and the leader line arranging unit 52 of the embodiment.

The leader line arrangement position determining program 320a does not need to be stored in the ROM 320 in advance. The leader line arrangement position determining program 320a may be stored in the HDD 330.

The program is, for example, stored in a "portable physical medium" such as a flexible disk (FD), a compact disc read only memory (CD-ROM), a digital versatile disc (DVD), a magneto-optical disc, an IC card to be inserted into the computer 300. The computer 300 may read the program from these and execute the program.

The program is stored in, for example, "another computer (or server)" connected to the computer 300 via a public network, the Internet, a LAN, a WAN, or the like. The computer 300 may read the program from the above-mentioned other computer or server and execute the program.

An embodiment of the present invention produces an effect of capable of arranging a leader line so that a correspondence with a part is easily understood.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium having stored therein a program that causes a computer to execute a process, the process comprising:
obtaining a shape of an object, the shape being displayed on a display and viewed from a designated viewpoint, the object including a plurality of part objects and being arranged in a three-dimensional CAD (Computer Aided Design) space, the obtaining the shape being performed by
- generating a first projection image of a part object of the object by perpendicularly projecting the part object onto a plane on which the viewpoint is present,
- generating, on the plane, a second projection image of another part object that is present closer to the plane than the part object in the three-dimensional CAD space, and
- generating, on the plane, an image, as the shape of the object, by making a portion of the first projection image invisible, the portion being overlapped with a portion of the second projection image on the plane;

specifying, on the plane, a drawing position for one end of a leader line in a visible area of the part object, the visible area being inside of a boundary of the obtained shape of the object;

obtaining a position on the part object in the three-dimensional CAD space, the position being an intersection at which a vector that is perpendicular to the plane and goes from the drawing position crosses the part object;

displaying, on the display, the object that is viewed from the designated viewpoint and the leader line whose one end is arranged at the obtained position on the part object, another end of the leader line being associated with information with respect to the part object; and determining a widest part of a part object included in the obtained shape of the object, wherein the specifying specifies the drawing position on the plane displayed widest in the part object included in the obtained shape of the object.

2. The non-transitory computer-readable recording medium according to claim 1, wherein the specifying specifies the drawing position avoiding a boundary of part objects included in the obtained shape of the object.

3. A method executed by a computer for determining an arrangement position of a leader line, the method comprising:

obtaining a shape of an object, the shape being displayed on a display and viewed from a designated viewpoint, the object including a plurality of part objects and being arranged in a three-dimensional CAD (Computer Aided Design) space, the obtaining the shape being performed by
- generating a first projection image of a part object of the object by perpendicularly projecting the part object onto a plane on which the viewpoint is present,
- generating, on the plane, a second projection image of another part object that is present closer to the plane than the part object in the three-dimensional CAD space, and
- generating, on the plane, an image, as the shape of the object, by making a portion of the first projection image invisible, the portion being overlapped with a portion of the second projection image on the plane;

specifying, on the plane, a drawing position for one end of a leader line in a visible area of the part object, the visible area being inside of a boundary of the obtained shape of the object;

obtaining a position on the part object in the three-dimensional CAD space, the position being an intersection at which a vector that is perpendicular to the plane and goes from the drawing position crosses the part object;

displaying, on the display the object that is viewed from the designated viewpoint and the leader line whose one end is arranged at the obtained position on the part object, another end of the leader line being associated with information with respect to the part object; and determining a widest part of a part object included in the obtained shape of the object, wherein the specifying specifies the drawing position on the plane displayed widest in the part object included in the obtained shape of the object.

4. A leader line arrangement position determining apparatus comprising:

a memory; and a processor coupled to the memory, the processor being configured to execute a process including:

receiving designation of a position of a viewpoint to display an object being arranged in a three-dimensional CAD (Computer Aided Design) space obtaining a shape of the object, the shape being displayed on a display and viewed from the designated viewpoint, the object including a plurality of part objects, the obtaining the shape being performed by
- generating a first projection image of a part object of the object by perpendicularly projecting the part object onto a plane on which the viewpoint is present,
- generating, on the plane, a second projection image of another part object that is present closer to the plane than the part object in the three-dimensional CAD space, and
- generating, on the plane, an image, as the shape of the object, by making a portion of the first projection image invisible, the portion being overlapped with a portion of the second projection image on the plane, specifying on the plane a drawing position for one end of a leader line in a visible area of the part object, the visible area being inside of a boundary of the obtained shape of the object, obtaining a position on the part object in the three-dimensional CAD space, the position being an intersection at which a vector that is perpendicular to the plane and goes from the drawing position crosses the part object, displaying, on the display, the object that is viewed from the designated viewpoint and the leader line whose one end is arranged at the obtained position on the part object, another end of the leader line being associated with information with respect to the part object, and determining a widest part of a part object included in the obtained shape of the object, wherein the specifying specifies the drawing position on the plane displayed widest in the part object included in the obtained shape of the object.

* * * * *